(12) United States Patent
Rocca

(10) Patent No.: US 10,194,240 B2
(45) Date of Patent: Jan. 29, 2019

(54) MICROPHONE ASSEMBLY AND METHOD OF REDUCING A TEMPERATURE DEPENDENCY OF A MICROPHONE ASSEMBLY

(71) Applicant: EPCOS AG, Munich (DE)

(72) Inventor: Gino Rocca, Copenhagen (DK)

(73) Assignee: TDK Corporation, Tokyo (JP)

( * ) Notice: Subject to any disclaimer, the term of this patent is extended or adjusted under 35 U.S.C. 154(b) by 69 days.

(21) Appl. No.: 15/304,961

(22) PCT Filed: Apr. 23, 2014

(86) PCT No.: PCT/EP2014/058227
§ 371 (c)(1),
(2) Date: Oct. 18, 2016

(87) PCT Pub. No.: WO2015/161874
PCT Pub. Date: Oct. 29, 2015

(65) Prior Publication Data
US 2017/0188145 A1    Jun. 29, 2017

(51) Int. Cl.
| | | |
|---|---|---|
| *H04R 3/00* | (2006.01) | |
| *H04R 19/00* | (2006.01) | |
| *H04R 19/04* | (2006.01) | |
| *H04R 29/00* | (2006.01) | |
| *H04R 31/00* | (2006.01) | |
| *H03G 3/00* | (2006.01) | |

(52) U.S. Cl.
CPC .............. *H04R 3/007* (2013.01); *H04R 3/00* (2013.01); *H04R 19/005* (2013.01); *H04R 19/04* (2013.01); *H04R 29/001* (2013.01); *H04R 31/00* (2013.01); *H03G 3/004* (2013.01)

(58) Field of Classification Search
CPC .... H04R 19/005; H04R 19/04; H04R 19/016; H04R 3/00; H04R 3/06; H04R 3/007; H04R 29/001; H04R 31/00; H04R 2499/11; H03G 3/004
See application file for complete search history.

(56) References Cited

U.S. PATENT DOCUMENTS

| | | | |
|---|---|---|---|
| 7,289,638 B2 | 10/2007 | Pavlovic et al. | |
| 7,889,030 B2 | 2/2011 | Schoen et al. | |
| 8,259,963 B2 * | 9/2012 | Stenberg ................. | H04R 3/06 381/113 |

(Continued)

FOREIGN PATENT DOCUMENTS

| | | | |
|---|---|---|---|
| JP | 2010045640 A | 2/2010 | |
| JP | 2010233102 A | 10/2010 | |

(Continued)

OTHER PUBLICATIONS

Klippel, W., "Active Compensation of Transducer Nonlinearities," AES 23rd International Conference, May 23-25, 2003, 17 pages.

*Primary Examiner* — Thang V Tran
(74) *Attorney, Agent, or Firm* — Slater Matsil, LLP

(57) ABSTRACT

A microphone assembly and a method for reducing a temperature dependency of a microphone assembly are disclosed. In an embodiment, the microphone assembly includes a transducer and a voltage supply for the transducer, wherein the voltage supply is configured to supply a temperature dependent voltage for reducing a temperature dependency of the microphone assembly.

14 Claims, 3 Drawing Sheets

(56) References Cited

U.S. PATENT DOCUMENTS

| | | | |
|---|---|---|---|
| 2006/0062406 A1* | 3/2006 | Kinoshita | H04R 3/00 381/113 |
| 2006/0147061 A1* | 7/2006 | Niwa | H03F 1/30 381/113 |
| 2009/0212877 A1* | 8/2009 | Ogasawara | H03B 5/04 331/116 M |
| 2009/0278217 A1 | 11/2009 | Laming et al. | |
| 2010/0166228 A1* | 7/2010 | Steele | A61B 8/4444 381/113 |
| 2010/0329487 A1 | 12/2010 | David et al. | |
| 2011/0150239 A1* | 6/2011 | Onishi | H03M 1/089 381/94.1 |
| 2011/0200212 A1 | 8/2011 | Wismar | |
| 2011/0311080 A1* | 12/2011 | Jaar | H04R 3/00 381/174 |
| 2012/0032555 A1* | 2/2012 | Koning | H03H 9/02448 310/315 |
| 2012/0230500 A1* | 9/2012 | Jasa | H04R 19/016 381/55 |
| 2012/0269363 A1* | 10/2012 | Suvanto | H04R 1/04 381/107 |
| 2013/0147567 A1* | 6/2013 | Yamakawa | H03B 5/30 331/154 |
| 2014/0177113 A1* | 6/2014 | Gueorguiev | H01L 27/0248 361/56 |
| 2014/0264652 A1* | 9/2014 | Cagdaser | H04R 19/04 257/416 |
| 2015/0181352 A1* | 6/2015 | Astgimath | H04R 3/00 381/174 |

FOREIGN PATENT DOCUMENTS

| | | |
|---|---|---|
| JP | 2011107086 A | 6/2011 |
| JP | 2012090224 A | 5/2012 |
| WO | 2011001195 A1 | 1/2011 |

\* cited by examiner

MICROPHONE ASSEMBLY AND METHOD OF REDUCING A TEMPERATURE DEPENDENCY OF A MICROPHONE ASSEMBLY

This patent application is a national phase filing under section 371 of PCT/EP2014/058227, filed Apr. 23, 2014, which is incorporated herein by reference in its entirety.

TECHNICAL FIELD

The present invention relates to a microphone assembly, in particular a condenser MEMS (Micro-Electrical-Mechanical Systems) microphone assembly, and a method for reducing a temperature dependency of a microphone assembly.

BACKGROUND

Patent application US 2011/0200212 A1 discloses a temperature compensated voltage pump in a MEMS based microphone. Patent application WO 2011/001195 A1 discloses changing a gain of an amplifier for maintaining a sensitivity value substantially constant in a temperature range. U.S. Pat. No. 7,889,030 B2 is directed to a passive temperature compensation of silicon MEMS devices.

SUMMARY OF THE INVENTION

Embodiments of the invention provide a microphone assembly with improved properties and an improved method for reducing a temperature dependency of a microphone assembly.

Embodiments of the invention relate to a microphone assembly. The microphone assembly comprises a transducer for converting an acoustical input signal into an electrical signal. The transducer may by manufactured by application of MEMS technology. The transducer may comprise a capacitor. In particular, an acoustical input signal may result in a change of capacitance of the transducer. Accordingly, the microphone may be a condenser or capacitor microphone. The transducer may comprise a diaphragm and a back-plate. By an acoustical input, in particular a pressure wave, the diaphragm may be deflected such that the distance between the diaphragm and the back-plate changes, resulting in a change of capacity of the transducer.

Furthermore, the microphone assembly comprises a voltage supply for the transducer. Thereby, a bias voltage can be applied to the transducer, in particular between a diaphragm and a back-plate of the transducer. By adjusting the value of the bias voltage the sensitivity of the transducer may be adjusted. The voltage supply may comprise a voltage generator, in particular a charge pump. The charge pump may be a Dickson charge pump. The voltage supply may be a part of an electronic circuit, in particular an electronic circuit fabricated as an ASIC (application-specific electronic circuit). As an example, the microphone assembly may comprise a MEMS die comprising the transducer and an ASIC die comprising the electronic circuit electrically connected to the MEMS die.

The voltage supply is configured to supply a temperature dependent voltage for reducing a temperature dependency of the microphone assembly. Ideally, a temperature independent sensitivity may be obtained. In particular, by adjusting the voltage, a temperature dependency of a specific component of the microphone assembly may be compensated. "Compensating" means that the temperature dependency is at least reduced, preferably significantly reduced.

A temperature dependency of the microphone assembly, in particular a dependency of the sensitivity and/or of the SNR (signal-to-noise ratio), is not desirable for users who expect the same audio quality independently of environmental conditions. Furthermore, a large dependency on temperature may also cause microphones to go into collapse at extreme temperatures. In a collapse, the diaphragm of the transducer contacts the back-plate. Due to the electrical field present between the diaphragm and the back-plate, the diaphragm may stick to the back-plate and the transducer may remain in the collapsed state until a restart is carried out. By reducing the temperature dependency, the transducer may be biased more "aggressively", in particular closer to collapse. Thereby, the transducer may be always optimally biased, independently of the temperature. This may increase the yield of the transducer. A large temperature dependency, however, may limit the use of a microphone to applications to a limited temperature range.

In an embodiment, the voltage supply may be configured to reduce a temperature dependency of the sensitivity of the microphone assembly. The microphone sensitivity may be defined as the value of an output signal at a microphone output in response to a predefined acoustic input signal.

The temperature dependency of the sensitivity of the microphone assembly may be caused by a temperature dependency of the sensitivity of the transducer and/or a temperature dependency of parts of an electronic circuit, in particular by the temperature dependency of a pre-amplifier.

In an embodiment, the voltage supply is configured to compensate a temperature dependency of the sensitivity of the transducer. Such a sensitivity drift with temperature may be caused by a temperature expansion of a package containing the transducer, which may induce stress in the diaphragm. The voltage supply may be designed for providing a lower voltage when the transducer is more sensitive and a higher voltage when the transducer is less sensitive. As an example, the sensitivity of the transducer may decrease with increasing temperature. In order to compensate this temperature drift, the supplied voltage may increase with increasing temperature. Preferably, the temperature coefficient of the voltage supply is adjusted to the temperature coefficient of the transducer, in particular such that a temperature compensation is achieved. The temperature coefficient of the voltage supply may be opposite in sign to the temperature coefficient of the transducer.

In an embodiment, the microphone assembly comprises an amplifier for processing a signal of the transducer. The amplifier may be a pre-amplifier. The amplifier may convert a high impedance electrical signal generated by the transducer into a low impedance signal. Moreover, the amplifier may adjust the signal level. The voltage supply may be configured to compensate a temperature dependency of the amplifier, in particular of the gain of the amplifier.

In an embodiment, the voltage supply may be configured to compensate both a temperature dependency of the transducer and of the amplifier. Alternatively or additionally also the temperature dependency of other parts of the microphone assembly may be compensated by providing an adjusted voltage.

In an embodiment, the temperature coefficient $TC_V$ of the voltage supply fulfills the following equation:

$$TC_V \equiv \frac{\partial V_{bias}}{\partial T} = -\frac{1}{k_{SV}}\left(TC_{mems,0|dB} + \frac{\partial G_{amp|dB}}{\partial T}\right) \quad \text{(E1)}$$

where T is the temperature, $V_{bias}$ is the bias voltage supplied to the transducer, $G_{amp|dB}$ is the gain of the electronic circuit in logarithmic units, $k_{SV}$ is the slope factor of the sensitivity of the transducer versus $V_{bias}$ and $TC_{mems,0|dB}$ is the temperature coefficient of the transducer in logarithmic units at an operating voltage $V_0$.

Details of the calculation of the temperature coefficient are given in the description of the exemplary embodiments in connection with the figures below.

By providing a voltage supply with a temperature coefficient as given by equation (E1), the temperature dependency of the sensitivity of the microphone assembly may be reduced. In particular, a temperature compensation of a temperature dependency of the transducer and of the electronic circuit may be achieved.

In the case that the temperature dependency of the electronic circuit is assumed to be negligible or is simply neglected, a suitable temperature coefficient of the voltage supply $TC_V$ may be calculated as:

$$TC_V \equiv -\frac{TC_{mems,0|dB}}{k_{SV}} \qquad (E2)$$

In this case, transducers with different temperature coefficients may be temperature compensated by using electronic circuits with matching temperature coefficients of the voltage supply.

A voltage supply with a matching temperature coefficient can be provided in different ways.

In an embodiment, the microphone assembly comprises a temperature dependent element for adjusting the supplied bias voltage as a function of temperature. The temperature dependent element may be operatively connected to a voltage generator, in particular to a charge pump. The temperature dependent element may be a part of the voltage supply. As an example, the temperature dependent element may comprise a temperature sensor. The temperature dependent element may provide an output signal dependent on the temperature. The value of the output signal may determine the value of the bias voltage provided by the voltage generator. In particular, the output signal may be an input signal for a voltage generator, adjusting the value of the bias voltage.

The microphone assembly, in particular the voltage supply, may comprise a memory, for example a non-volatile memory. The memory may provide an input signal to a voltage generator, such as a charge pump. The value of the input signal may determine the value of the generated bias voltage. The memory may enable a calibration of the voltage supply. In a calibration routine, a parameter of the microphone may be determined. Depending on the values of the parameter, the memory may be programmed such that the temperature coefficient of the voltage supply is adjusted to the value of the determined parameter for reducing a temperature dependency. In particular, the temperature coefficient of the voltage supply may be adjusted to the temperature coefficient of the transducer. The memory may be part of the temperature dependent element or may process a signal of the temperature dependent element.

In an embodiment, the voltage supply may be chosen such that its temperature coefficient matches a temperature coefficient of a component of the microphone assembly. In particular, the voltage supply may be chosen such that its temperature coefficient matches the temperature coefficient of the transducer. "Matching" means that the temperature coefficient of the voltage supply enables a compensation of the temperature dependence of the transducer. In particular, for a specific transducer, a voltage supply having a matching temperature coefficient may be chosen before assembling the transducer and the voltage supply. By choosing a voltage supply with a matching temperature coefficient, a calibration routine may not be required.

As an example, a bunch of transducers and voltage supplies may be provided. Parameters of the transducers may be determined before the transducers are assembled with the voltage supplies. In particular, the temperature coefficients of the transducers are determined. The transducers may be sorted depending on their temperature coefficients. Furthermore, parameters of the voltage supply, for example of a voltage generator such as a charge pump, may be determined. In particular, the temperature coefficients of the voltage supplies may be determined. Then the transducers are combined with a voltage supply having a matching temperature coefficient.

A further aspect of the present disclosure relates to a method of reducing a temperature dependency of a microphone assembly. Features described with respect to the microphone assembly are also disclosed herein with respect to the method and vice versa, even if the respective feature is not explicitly mentioned in the context of the specific aspect.

The method comprises the step of providing a transducer and determining a temperature dependency of the transducer. In particular, a temperature dependency of the sensitivity of the transducer may be determined. As an example, the temperature coefficient of the sensitivity may be determined. In particular, the transducer may be fabricated as a MEMS die. Furthermore, a voltage supply is provided. The voltage supply may be part of an electronic circuit. The voltage supply may be fabricated as an ASIC die. The voltage supply is chosen such that it enables supplying a temperature dependent voltage for compensating the temperature dependency of the transducer. After that, the transducer is assembled with the voltage supply.

In an embodiment of the method, the temperature coefficient of the voltage supply is determined before the voltage supply is assembled with the transducer. The transducer may be only assembled with the voltage supply if the temperature coefficient of the voltage supply matches the temperature coefficient of the transducer.

As an example, a number of transducers may be characterized and sorted depending on their temperature coefficients. Furthermore, a number of voltage supplies may be provided. The voltage supplies may be part of an electronic circuit. The voltage supplies and/or the electronic circuits may be characterized and sorted depending on their temperature coefficients. Each transducer may be assembled with a voltage supply having a matching temperature coefficient. Alternatively or additionally, the temperature coefficient of an amplifier may be determined and the transducer and/or voltage supply may be assembled with an amplifier having a matching temperature coefficient.

In an embodiment of the method, the voltage supply is calibrated after assembling the voltage supply with the transducer. The calibration may set the temperature coefficient of the voltage supply such that it matches the temperature coefficient of the transducer. Therein, a memory as explained above may be involved. The calibration routine may involve measuring the sensitivity of the microphone assembly. Furthermore, the calibration routine may involve calculating the slope factor of the sensitivity of the transducer versus the voltage supplied by the voltage supply.

BRIEF DESCRIPTION OF THE DRAWINGS

Further features, refinements and expediencies become apparent from the following description of the exemplary embodiments in connection with the figures.

DETAILED DESCRIPTION OF ILLUSTRATIVE EMBODIMENTS

Figure 1:
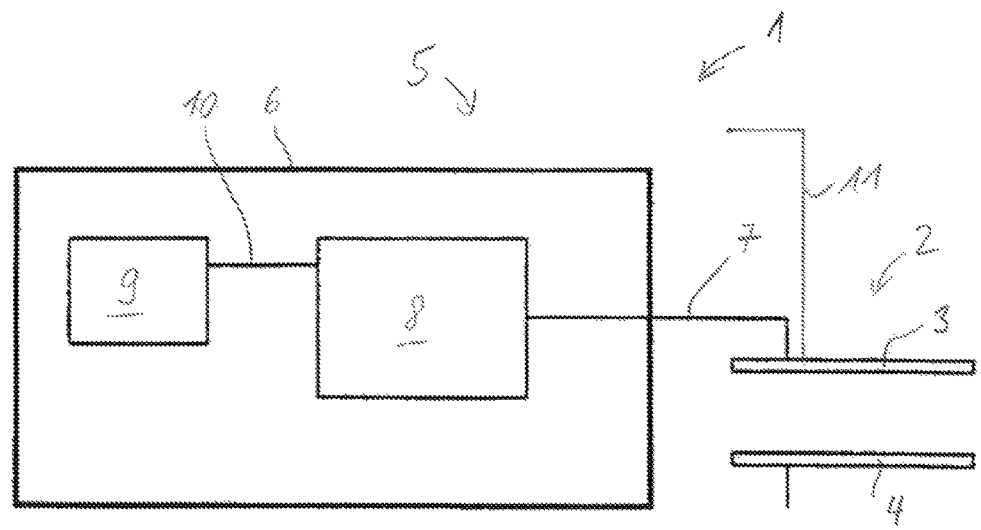
FIG. 1 shows a schematic block diagram illustrating an embodiment of a microphone assembly.

FIG. 1 shows a schematic block diagram of an embodiment of a microphone assembly 1, in particular a condenser microphone assembly. The microphone assembly 1 comprises a transducer 2 for converting an acoustical input signal into an electrical signal. The transducer 2 is a MEMS transducer. As an example, the transducer may comprise a semiconductor material such as silicon or gallium arsenide. The transducer 2 comprises a diaphragm 3 and a back-plate 4. On an acoustical input, the diaphragm 3 is deflected towards the back-plate 4, whereby the capacitance of the transducer 2 changes, resulting in an electrical signal at an input line 11 of an electronic circuit 5 of the microphone assembly 1. The electrical signal is further processed by the electronic circuit 5 into an output signal of the microphone assembly 1. The output signal of the microphone assembly 1 may be digital or analogue.

The electronic circuit 5 may be fabricated as an ASIC (application-specific electronic circuit). The microphone assembly 1 may comprise a MEMS die comprising the transducer 2 and an ASIC die comprising the electronic circuit 5. The electronic circuit 5 comprises a voltage supply 6 for providing the transducer 2 with a bias voltage via a bias line 7. The voltage supply 6 comprises a voltage generator 8, for example a charge pump, in particular a Dickson charge pump. The bias voltage is a DC bias voltage and may be in the range of 8 V to 15 V, for example.

The voltage supply 6 further comprises a temperature dependent element 9 for adjusting the value of the bias voltage supplied by the charge generator 8 as a function of temperature. In particular, the temperature dependent element 9 may be a temperature sensor. The temperature dependent element 9 supplies a control voltage to the voltage generator 8 via a control line 10. Depending on the control voltage, the charge generator 8 provides a bias voltage such that a temperature dependency of the transducer 2 is compensated. In particular, the temperature dependency of the sensitivity of the transducer 2 may be compensated. The voltage supply 6 may further comprise a memory for enabling a calibration. The memory may be operatively connected to the temperature dependent element 9 and the charge generator 8.

A sensitivity drift with temperature may be induced by a temperature expansion of a package containing the transducer 2. This expansion may induce stress in the diaphragm.

Furthermore, by adjusting the bias voltage, a collapse of the transducer 2 at extreme temperature conditions may be prevented.

In further embodiments, the voltage supply 6 may additionally compensate the temperature dependency of further elements of the electronic circuit 5, for example of the gain of an amplifier (not shown in FIG. 1) connected to the input line 11.

Figure 2:
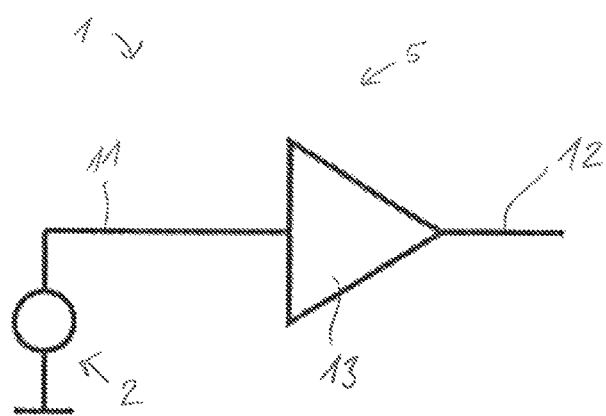
FIG. 2 shows a schematic block diagram illustrating parameters of a microphone assembly.

FIG. 2 shows a schematic block diagram illustrating parameters of a microphone assembly 1, for example of the microphone assembly 1 of FIG. 1. The transducer 2 is connected to an electronic circuit 5 via an input line 11. The electronic circuit 5 comprises an amplifier 13, in particular a pre-amplifier, which processes the electrical signal generated by the transducer 2. In particular, the amplifier 5 may transform a high impedance electrical signal of the transducer 2 into a low impedance signal with the correct signal level at an output 12 of the microphone assembly 1.

The microphone sensitivity $S_{out}$ characterizes the value of the output signal at the output 12 of the microphone assembly 1 in response to a specific acoustic input signal. The microphone sensitivity $S_{out}$ can be calculated as $$S_{out} = S_{mems} \cdot G_{amp} \tag{1}$$

where $S_{mems}$ is the unloaded sensitivity of the transducer 2, i.e. the non-amplified sensitivity of the transducer 2, and $G_{amp}$ is the gain of the amplifier 13, including the loss at the transducer-amplifier interface.

It is often convenient to carry out calculations on the sensitivity in logarithmic units, arriving at $$S_{out|dB} = S_{mems|dB} + G_{amp|dB} \tag{2}$$

The temperature coefficient $TC_{S|dB}$ of the microphone sensitivity $S_{out|dB}$ can be defined as:

$$TC_{S|dB} \equiv \frac{\partial S_{out|dB}}{\partial T} = \frac{\partial S_{mems|dB}}{\partial T} + \frac{\partial G_{amp|dB}}{\partial T} \equiv TC_{mems|dB} + TC_{amp|dB} \tag{3}$$

Accordingly, the temperature coefficient $TC_{S|dB}$ of the microphone sensitivity is the sum of the temperature coefficient $TC_{mems|dB}$ of the transducer and the temperature coefficient $TC_{amp|dB}$ of the amplifier. The temperature coefficient $TC_{mems|dB}$ may include the temperature dependency of the voltage supply. In case that temperature coefficients of further parts of the electronic circuit should be regarded, the calculations may be adjusted, accordingly. For reducing the temperature drift of the microphone assembly, the temperature drift of the transducer and/or the temperature drift of the amplifier may be reduced.

Figure 3:
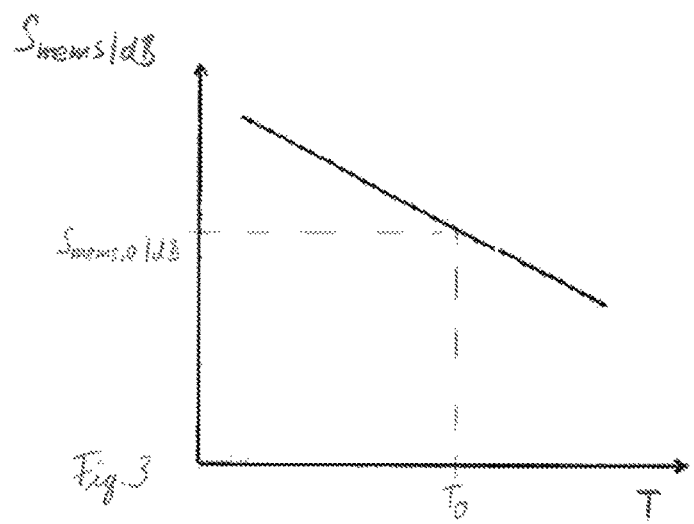
FIG. 3 shows a schematic diagram of the sensitivity of a transducer at constant bias voltage as a function of temperature.

FIG. 3 shows a schematic diagram of the sensitivity $S_{mems|dB}$ in logarithmic units of a transducer at constant bias voltage $V_0$ as a function of temperature T, for example of the transducer 2 in the microphone assembly 1 as shown in FIG. 1. $S_{mems}$ may be provided in dBV/Pa or dB, for example. The temperature coefficient $TC_{S|dB}$ may be given in dB/° C., for example.

As can be seen from FIG. 3, the sensitivity $S_{mems|dB}$ decreases with a rise of temperature T. In the shown example, the sensitivity $S_{mems|dB}$ depends linearly on the temperature T, with the temperature coefficient $TC_{mems,0|dB}$ of the transducer 2 at constant voltage being the slope of the curve. The temperature may be in a range of 0° C. to 50° C., for example. The linear dependency is valid at least around an operating temperature $T_0$. At the operating voltage $V_0$ and the operating temperature $T_0$, the sensitivity of the transducer has the value $S_0$. The operating temperature $T_0$ may be an ambient temperature, for example 20° C. The operating temperature may be in a range of 10° C. to 30° C., for example. The slope of the curve may model not only the temperature dependency of the isolated transducer but may include also the effect of the package.

Figure 4:
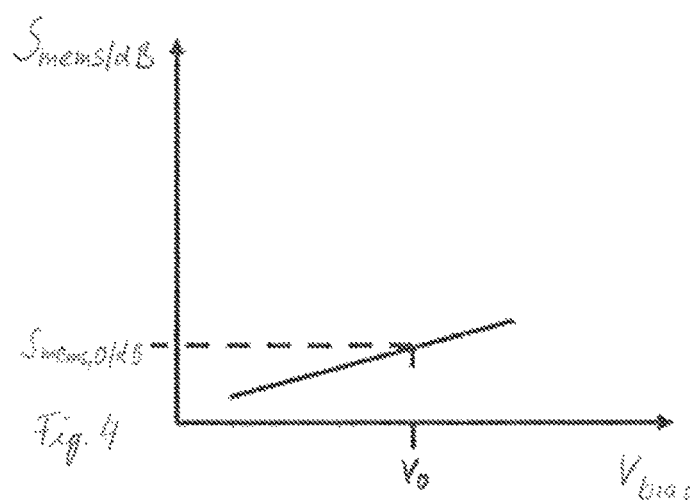
FIG. 4 shows a schematic diagram of the sensitivity of a transducer at constant temperature as a function of bias voltage.

FIG. 4 shows a schematic diagram of the sensitivity $S_{mems|dB}$ of a transducer as a function of the supplied bias voltage $V_{bias}$ at constant Temperature $T_0$. The diagram has been obtained by measurements on final microphones. The value of the sensitivity $S_{mems|dB}$ at an operating voltage $V_0$ and temperature $T_0$ is $S_{mems,0|dB}$. In the vicinity of the operating voltage $V_0$, the sensitivity $S_{mems|dB}$ is linear with bias voltage $V_{bias}$. The slope factor $k_{SV}$ is the slope of the curve around the operating voltage $V_0$.

The linear dependencies as shown in FIGS. 3 and 4 allow us to write $S_{mems|dB}$ in the vicinity of the operating voltage $V_0$ and the operating temperature $T_0$ as follows:

$$S_{mems|dB} \approx k_{SV} \cdot (V_{bias} - V_0) + TC_{mems,0|dB} \cdot (T - T_0) + S_{mems,0|dB} \quad (4)$$

From equation (4), remembering (3) follows:

$$TC_{S|dB} \approx k_{SV} \cdot \frac{\partial V_{bias}}{\partial T} + TC_{mems,0|dB} + \frac{\partial G_{amp|dB}}{\partial T} = \quad (5)$$
$$k_{SV} \cdot TC_V + TC_{mems,0|dB} + TC_{amp|dB}$$

Equation (5) can be considered as a general expression for the microphone temperature coefficient, since it captures the temperature dependency of the sensitivity of the electronic circuit through bias voltage and gain of the transducer.

From equation (5), a temperature compensated microphone over a temperature range [T1-T2] may be achieved by:

$$TC_{S|dB} = 0 \text{ for } T_1 < T < T_2 \quad (6)$$

or $$TC_V \equiv \frac{\partial V_{bias}}{\partial T} = -\frac{1}{k_{SV}} \left( TC_{mems,0|dB} + \frac{\partial G_{amp|dB}}{\partial T} \right) \quad (7)$$

By determining the temperature coefficient $TC_{mems,0|dB}$ of the transducer at an operating voltage $V_0$ and the slope factor $k_{SV}$, the temperature coefficient $TC_V$ required for compensating the temperature drift of the transducer can be determined.

Equation (7) offers a general method to calculate the temperature coefficient for the voltage supply once the gain and parameters from the transducer are available.

Alternatively, the temperature coefficient of the gain of the amplifier may be calculated once the temperature coefficient of the voltage supply and of the transducer is determined.

The transducer may be designed such that $$\frac{\partial G_{amp|dB}}{\partial T} = o,$$

which yields to $$TC_V \equiv \frac{\partial V_{bias}}{\partial T} = -\frac{TC_{mems,0|dB}}{k_{SV}} \quad (8)$$

Figure 5:
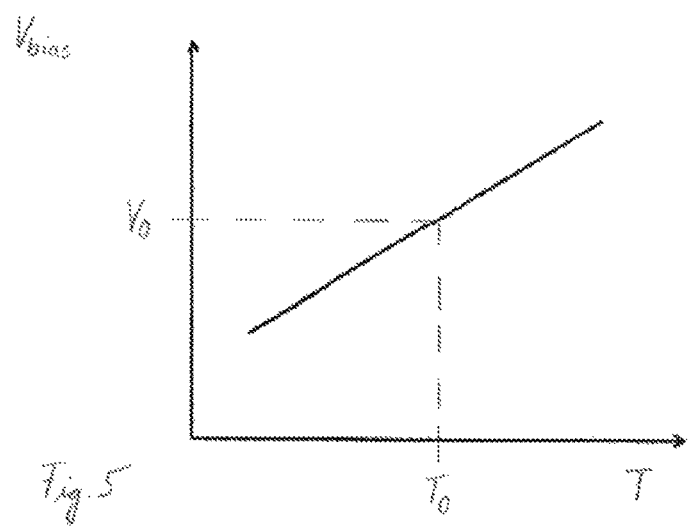
FIG. 5 shows a schematic diagram of a bias voltage supplied to a transducer as a function of temperature.

FIG. 5 shows a schematic diagram of a bias voltage $V_{bias}$ supplied to a transducer as a function of temperature T in order to compensate the temperature drift as shown in FIG. 3. The bias voltage $V_{bias}$ may be supplied by a voltage supply 6 as shown in FIG. 1, using a temperature dependent element 9 and a voltage generator 8. The bias voltage $V_{bias}$ is configured to depend linearly on the temperature T, with the temperature coefficient $TC_V$ being the slope of the curve. The temperature coefficient $TC_V$ of the voltage supply 6 fulfils equation (8) and, accordingly has the value of the ratio of the temperature coefficient of the transducer and the slope factor, but is opposite in sign to the temperature coefficient of the transducer.

This enables a compensation of the temperature dependency of the sensitivity $S_{mems}$ of the transducer and, thereby, a reduction of the temperature dependency of the microphone assembly.

The diagram as shown in FIG. 3 schematically illustrates the sensitivity $S_{mems}$ of a specific transducer as a function of temperature T. However, the exact value of the temperature coefficient $TC_{mems}$ may vary significantly due to process tolerances. Also the slope factor $k_{SV}$ may vary significantly. Therefore, an effective compensation of the temperature drift of a transducer may require matching the temperature coefficient of the compensating element, in particular of the voltage supply, to the temperature coefficient of the specific transducer.

Figure 6:
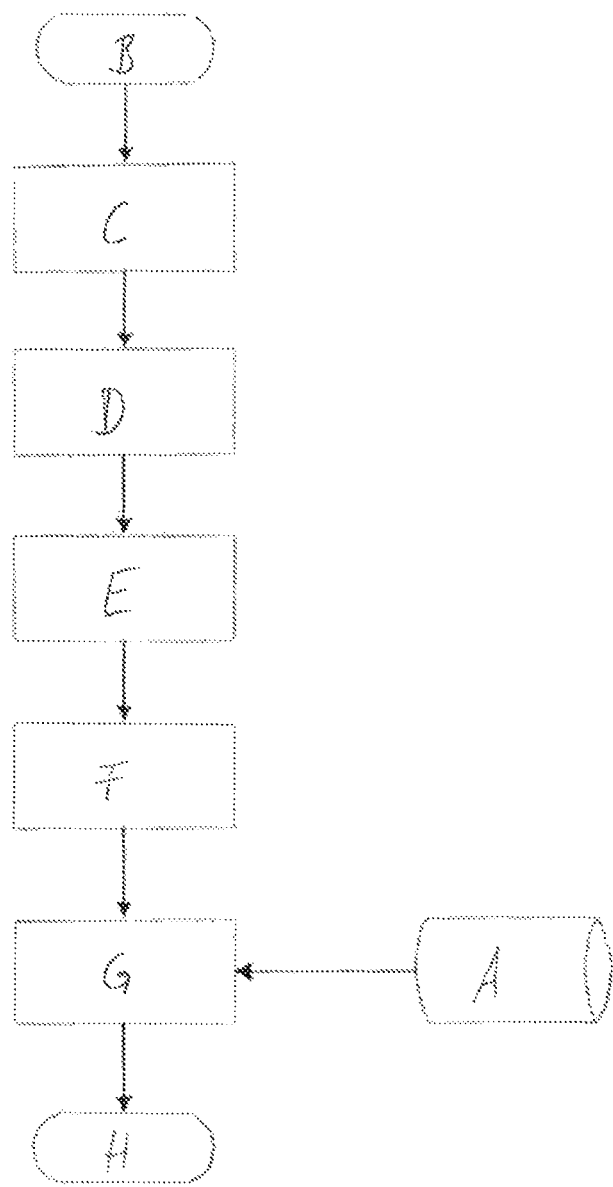
FIG. 6 shows a schematic block diagram illustrating a method of temperature compensation.

FIG. 6 shows a flow chart illustrating a method of calculating a suitable temperature coefficient $TC_V$ of the voltage supply for achieving a temperature compensation. In this case, the gain of the transducer is designed as being constant over temperature or the temperature drift of the transducer is neglected.

In step A, the transducer is characterized. This characterization is preferably carried out before the transducer is assembled with the electronic circuit, in particular with the voltage supply and the pre-amplifier. Specifically, the temperature coefficient $TC_{mems,0|dB}$ of the transducer at the operating voltage $V_0$ and in the vicinity of the operating temperature $T_0$ is measured.

After that, the transducer is assembled with the voltage supply, in particular with the electronic circuit. Step B denotes the start of the measurements at the microphone assembly. Preferably, the microphone assembly is the final component. As an example, the microphone assembly may comprise a MEMS die and an ASIC die, being electrically connected to each other. The assembly comprises an output for the electrical signal, which is generated by the transducer and processed by the electronic circuit.

In step C, the sensitivity $S_{out}$ of the microphone assembly is measured at the output of the assembly. The bias voltage is set to a predefined voltage, for example to the operating voltage $V_0$.

In step D, the bias voltage $V_{bias}$ is increased by $\Delta V_{bias}$. Accordingly the new bias voltage is as follows:

$$Vbias = Vo + \Delta Vbias$$

Then, in step E the sensitivity $S_{out}$ of the microphone assembly is measured again at the output.

In step F, the slope factor $k_{SV}$ is calculated from the measured sensitivities at different bias voltages, assuming a linear dependency as shown in FIG. 4.

In step G, the temperature coefficient $TC_V$ of the voltage supply is calculated by using equation (8).

Step H denotes the end of the calibration routine.

Based on the calibration routine, the temperature coefficient $TC_V$ of the voltage supply can be set, for example by means of a non-volatile memory.

The invention claimed is:

1. A microphone assembly comprising:
a transducer comprising a diaphragm and a back-plate; and
a voltage supply for supplying a bias voltage between the diaphragm and the back-plate of the transducer,
wherein the supplied bias voltage is a temperature dependent voltage for reducing a temperature dependency of a sensitivity of at least parts of the microphone assembly, and
wherein the supplied bias voltage changes with a temperature such that a change in a sensitivity of the parts is reduced as compared to a change in a sensitivity at a constant bias voltage.

2. The microphone assembly of claim 1, wherein the supplied bias voltage changes with the temperature such that a change in an overall sensitivity of the microphone assembly is reduced.

3. The microphone assembly of claim 1, wherein the supplied bias voltage changes with the temperature such that a change of a sensitivity of the transducer is reduced.

4. The microphone assembly of claim 1, further comprising an amplifier for processing a signal of the transducer, wherein the supplied bias voltage changes with the temperature such that a change of a gain of the amplifier with the temperature is reduced.

5. The microphone assembly of claim 1, wherein the voltage supply comprises a temperature dependent element for adjusting the supplied voltage as a function of the temperature.

6. The microphone assembly of claim 1, wherein the voltage supply comprises a memory for enabling a calibration of the voltage supply such that the supplied bias voltage changes with the temperature.

7. The microphone assembly of claim 1, wherein a temperature coefficient of the voltage supply matches a temperature coefficient of the transducer.

8. The microphone assembly of claim 7, wherein the temperature coefficient of the voltage supply is opposite in sign to the temperature coefficient of the transducer.

9. The microphone assembly of claim 7, wherein the temperature coefficient of the voltage supply is $$TC_{VS} \equiv \frac{\partial V_{bias}}{\partial T} = -\frac{1}{k_{SV}}\left(TC_{mems,0|dB} + \frac{\partial G_{amp|dB}}{\partial T}\right)$$

wherein T is the temperature, $V_{bias}$ is a bias voltage supplied to the transducer, $G_{amp|dB}$ is a gain of an electronic circuit in logarithmic units, $k_{SV}$ is a slope factor of a sensitivity of the transducer versus $V_{bias}$ and $TC_{mems,0|dB}$ is the temperature coefficient of the transducer in logarithmic units at an operating voltage $V_0$.

10. The microphone assembly of claim 7, wherein the temperature coefficient of the voltage supply is $$TC_{VS} \equiv \frac{\partial V_{bias}}{\partial T} = -\frac{TC_{mems,0|dB}}{k_{SV}}$$

wherein T is the temperature, $V_{bias}$ is a bias voltage supplied to the transducer, $k_{SV}$ is a slope factor of a sensitivity of the transducer versus $V_{bias}$ and $TC_{mems,0|dB}$ is the temperature coefficient of the transducer in logarithmic units.

11. A method of reducing a temperature dependency of a microphone assembly, the method comprising:
providing a transducer and determining a temperature dependency of the transducer including a temperature coefficient;
providing a voltage supply for supplying a bias voltage between a diaphragm and a back-plate of the transducer, wherein the voltage supply enables supplying a temperature dependent voltage for compensating a temperature dependency of the transducer;
determining a temperature coefficient of the voltage supply; and
assembling the transducer with the voltage supply, wherein the transducer is only assembled with the voltage supply if the temperature coefficient of the voltage supply matches the temperature coefficient of the transducer.

12. A method of reducing a temperature dependency of a microphone assembly, the method comprising:
providing a transducer;
providing a voltage supply for supplying a bias voltage between a diaphragm and a back-plate of the transducer; and
assembling the transducer with the voltage supply,
wherein, after assembling, the voltage supply is calibrated such that a temperature coefficient of the voltage supply matches a temperature coefficient of the transducer.

13. The method of claim 12, wherein a calibration involves calculating a slope factor of a sensitivity of the transducer versus the voltage supplied by the voltage supply.

14. The method of claim 12, wherein a calibration involves measuring a sensitivity of the microphone assembly.

* * * * *